United States Patent [19]

Sherman et al.

[11] Patent Number: 4,564,770

[45] Date of Patent: Jan. 14, 1986

[54] SOLID STATE RELAY WITH FAST TURNOFF

[75] Inventors: Jeffrey D. Sherman, Billerica; Stephen E. Courcy, Westford, both of Mass.

[73] Assignee: RCA Corporation, Princeton, N.J.

[21] Appl. No.: 479,988

[22] Filed: Mar. 29, 1983

[51] Int. Cl.[4] .................. H03K 3/42; G02B 27/00
[52] U.S. Cl. ................... 307/311; 307/570; 307/580; 250/551
[58] Field of Search .......... 307/311, 256, 580, 248, 307/570, 254; 250/211 J, 552, 551; 328/2; 357/19

[56] References Cited

U.S. PATENT DOCUMENTS

| | | | |
|---|---|---|---|
| 4,068,135 | 1/1978 | Sonobe et al. | 307/352 |
| 4,227,098 | 10/1980 | Brown et al. | 307/311 |
| 4,296,331 | 10/1981 | Rodriguez | 250/551 |
| 4,307,298 | 12/1981 | El Hamamsy et al. | 250/551 |
| 4,319,145 | 3/1982 | Apfelbeck | 307/311 |
| 4,323,774 | 4/1982 | Kopp | 250/214 A |
| 4,323,799 | 4/1982 | King et al. | 307/571 |
| 4,329,625 | 5/1982 | Nishizawa et al. | 315/158 |
| 4,390,790 | 5/1983 | Rodriguez | 250/551 |
| 4,419,586 | 12/1983 | Phipps | 250/551 |
| 4,500,801 | 2/1985 | Janutka | 307/570 |
| 4,535,202 | 8/1985 | Meunier | 179/18 FA |

OTHER PUBLICATIONS

Letter from William Sheng to Mr. Jeff Sherman dated Feb. 9, 1983 "Power-saving SSRs Separate Switching and Control" by William W. Sheng, *Electronic Design*, May 27, 1982, pp. 163–169.

*Primary Examiner*—Stanley D. Miller
*Assistant Examiner*—Richard Roseen
*Attorney, Agent, or Firm*—Joseph S. Tripoli; Robert L. Troike; Raymond E. Smiley

[57] ABSTRACT

A solid state relay having a light-emitting diode, an array of series connected photodiodes, a field-effect-transistor (FET) and optically controlled switch for FET turn off is described.

The light-emitting diode is optically coupled to the array of photodiodes. Turn on of the transistor is determined entirely by the voltage developed by the array of photodiodes. Turn off of the transistor is determined by the state of the optically controlled switch.

5 Claims, 1 Drawing Figure

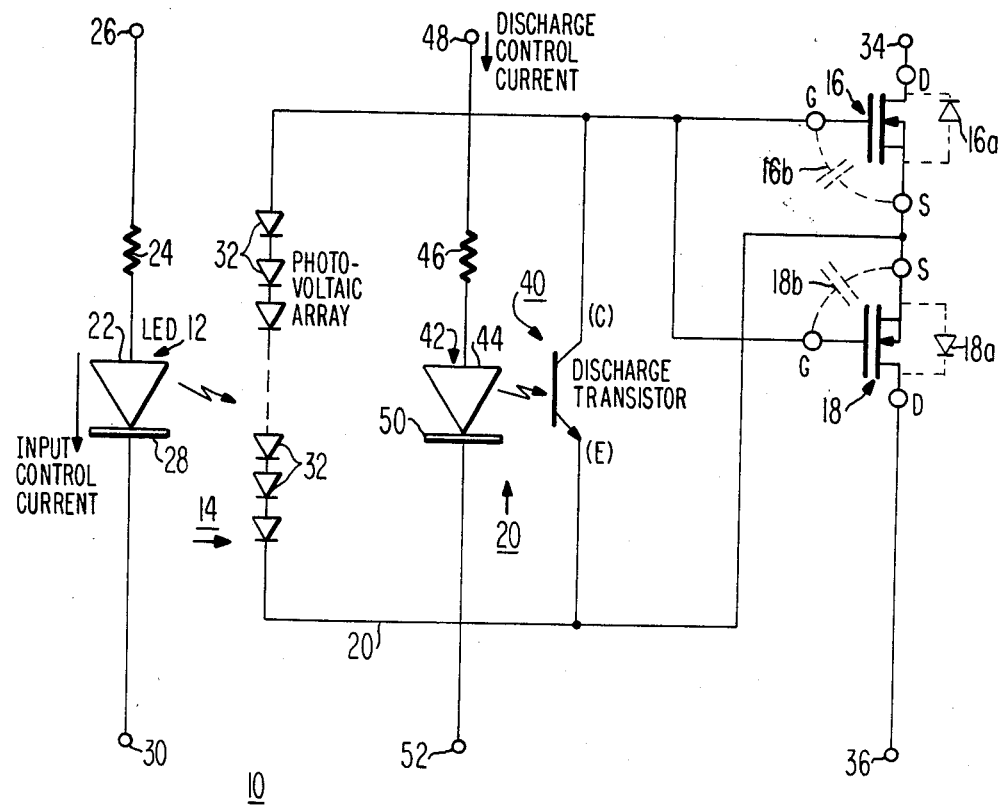

SOLID STATE RELAY WITH FAST TURNOFF

The U.S. Government has rights in this invention pursuant to Contract Number DAAE07-81-C-4022.

This invention relates to a solid state relay, and more particularly, to a solid state relay incorporating a circuit for fast turnoff.

BACKGROUND OF INVENTION

Solid state (SS) relays providing great isolation between the control signal and relay "contacts" are known. See U.S. Pat. No. 4,227,098, issued Oct. 7, 1980, to D. N. Brown, et al. Such a solid state relay typically utilizes a field-effect transistor (FET) as the switched element. The cycle time (total turn-on and turn-off time) in a solid state relay is limited by the inherent characteristics of the solid state relay components. In particular, parasitic capacitance exists between the gate and source of an FET. Because of the capacitance, as input current is increased relay turn-on time desirably decreases but turn-off time undesirably increases. This undesirable slow turn-off occurs because a relatively high input control current charges the gate-to-source capacitor faster and to a higher voltage than would a lower control current. The higher voltage results in a relatively longer discharge time which slows the turn-off of the FET and therefore of the solid state relay.

To overcome this slow turn-off, prior art relays (U.S. Pat. No. 4,227,098, for example) utilize a gate-to-source resistor to provide a discharge path with the lower the resistor value, the faster the turn-off time. However, a lower resistor value results in a lower gate-to-source current during turn-on which results in a slower turn-on time.

SUMMARY OF THE INVENTION

In accordance with a preferred embodiment of the present invention, a solid state relay of the type comprising a field effect transistor having a pair of electrodes forming a principal conduction path and having a control electrode and comprising photodiode means connected between the control electrode and one of the principal electrodes for controlling the turn-on of the FET, further includes switch means also coupled between the control electrode and one of the principal electrodes for selectively providing a low impedance path to turn off the FET.

BRIEF DESCRIPTION OF THE DRAWING

The sole FIGURE is an electrical schematic diagram of a solid state relay in accordance with a preferred embodiment of the present invention.

DETAILED DESCRIPTION OF A PREFERRED EMBODIMENT

Solid state relay 10 comprises a light emitting diode (LED) 12, a photovoltaic array 14 coupled to receive light from the LED, first and second field effect transistors (FET's) 16 and 18 and a discharge circuit 20. Anode 22 of LED 12 is coupled via a current limiting resistor 24 to a relay input terminal 26. Cathode 28 of LED 12 is coupled to a relay input terminal 30. LED 12 may be of the type manufactured by National Semiconductor as Model No. CXC-1316, and producing 1.0 mW of radiant output power for 15 mA input current. Photovoltaic array 14 comprises a plurality such as sixteen of series connected photodiodes 32. The array is commercially available from Dionics, Inc., 65 Rushmore Street, Westbury, New York 11590 as Model No. DI-16 V8 receptive of 1.0 mW of radiant power from LED 12 for producing 6.0 volts.

Photovoltaic array 14 is coupled at one end thereof between the gates (G) of FET's 16 and 18 and is coupled at the other end thereof to the sources (S) of FET's 16 and 18. The sources are also connected to the substrate electrodes of the FETs as indicated by the arrow in each FET. The drains (D) of the two transistors 16 and 18 are connected to respective output terminals 34 and 36. The gate of each transistor is the control electrode thereof while the primary conductive path is between the source and drain electrodes of the transistor. Transistors 16 and 18 are typically DMOS transistors which are manufactured by Supertex, Inc., as Model No. VNO1, and having 60 volt breakdown voltage and 2.5 ohm drain-to-source resistance in the conductive mode. The transistors 16 and 18 are essentially connected in series to provide the transmission of both positive and negative analog signals through the primary conduction path. The DMOS transistors of the type above described are known to have an internal diode characteristic as illustrated in phantom at 16a and 18a. A single transistor such as transistor 16 would conduct under the application of a negative voltage to the drain electrode in its non-conductive state. A conventional single JFET could be used at the expense of increased resistance, in its conductive state, and/or decreased breakdown voltages.

FET transistors 16 and 18 of the type above described are known to have gate-to-source parasitic capacitances as illustrated in phantom at 16b and 18b respectively. To discharge these capacitors upon turn-off of the FET's as will be hereinafter described, a discharge bipolar NPN photosensitive transistor 40 is connected at its collector (C) to the gates of transistors 16 and 18 and connected at its emitter (E) to the sources of transistors 16 and 18. That is, transistor 40 is connected in parallel with photovoltaic array 14. Transistor 40 which may be of the type manufactured by Dionics, Inc., as Model No. DN1006-2 is of the type rendered conductive or non-conductive by means of the presence or absence, respectively, of light supplied to its base electrode. LED 42 is such a light source. LED 42 is similar to LED 12 connected at its anode 44 via current limiting resistor 46 to a control terminal 48 while cathode 50 is connected to a control terminal 52.

In operation, when it is desired to turn "on" the solid state relay 10, current is passed between terminals 26 and 30 causing LED 12 to become illuminated. The resulting illumination causes photovoltaic array 14 to generate a voltage which is impressed between the gates of transistors 16 and 18 and the sources thereof (and consequently, the substrate electrodes thereof) causing transistors 16 and 18 to be rendered conductive such that a very low impedance path on the order of 5 ohms with analog signal range of plus and minus sixty volts is formed. During the time that LED 12 is illuminated, LED 42 is not illuminated and thus transistor 40 is in its open circuit condition. When thereafter it is desired to turn "off" the solid state relay 10, current is removed from LED 12 resulting in the absence of voltage being produced by photovoltaic array 14.

In the absence of discharge transistor 40, the voltage impressed on capacitor 16b and 18b, as a result of the respective transistors being rendered conductive, would slowly decay such that eventually the transistors would be rendered non-conductive.

However, in accordance with the invention, current is supplied between terminals 48 and 52 to LED 42, causing it to be illuminated. The resultant illumination causes discharge transistor 40 to be rendered conductive thereby providing a very low impedance path between the gates of transistors 16 and 18 and the sources (and substrate electrodes thereof). This low impedance path causes the very rapid discharge of capacitors 16*b* and 18*b* and therefore the very rapid turn-off of transistors 16 and 18, a typical turn-off time being 40 microseconds with a 150 killohm load. With the FET transistors turned off, a very high impedance path is created between output terminals 34 and 36 typically on the order of 10,000 megohms, with a breakdown voltage of plus and minus sixty volts. The signal between terminals 48 and 52 to turn on LED 42 may occur simultaneously with the removal of current between terminals 26 and 30, resulting in the fastest turn-off time. If the signal between terminals 48 and 52 to turn on LED 42 occurs before removal of current between terminals 26 and 30, the output channel between terminals 34 and 36 will return to the "Off" state but in a longer time than with the simultaneous turn off of LED 12 and turn on of LED 42.

Without the use of discharge transistor 40 and in its place a fixed high impedance resistor, typical cycle time of solid state relay 10, that is, time to turn on and then turn off was on the order of one millisecond. With the addition of discharge transistor 40, typical cycle time is on the order of 150 microseconds. Thus it can be seen that by providing discharge transistor 40, the cycle time is improved by a factor of seven. Also, even faster cycle times can be achieved simply by increasing the LED 12 and LED 42 control currents.

What is claimed is:

1. In a solid state relay comprising in combination:
   a pair of input terminals;
   a light-emitting diode connected between said input terminals for generating radiation in response to current applied to said input terminals;
   an array of photodiodes series connected between a pair of array electrodes and optically coupled to said light-emitting diode for developing a control voltage across said array electrodes in response to radiation from said light-emitting diode;
   a field-effect-transistor (FET) including a pair of electrodes defining a principal conduction path, and a control electrode, one of said array electrodes coupled to said control electrode and the other of said array electrodes coupled to one of said FET pair of electrodes, whereby the impedance between said FET pair of electrodes has a first value in the absence of, and another greatly different second value in the presence of, said control voltage between said control electrode and said one of said FET pair of electrodes;
   the improvement comprising:
   an optical bipolar transistor coupled between said control electrode and said one of said FET pair of electrodes for providing a relatively low impedance therebetween when said FET impedance is at said first value and for providing a relatively high impedance when said FET impedance is at said second value; and
   a second light emitting diode optically coupled to said bipolar transistor and responsive to a signal for controlling the state of conduction of said bipolar transistor.

2. The combination as set forth in claim 1 wherein said field-effect-transistor is an insulated gate field-effect-transistor.

3. The combination as set forth in claim 1 wherein said field-effect-transistor is an enhancement mode insulated gate field-effect-transistor.

4. The combination as set forth in claim 1 wherein said field-effect-transistor is a depletion mode insulated gate field-effect-transistor.

5. The combination as set forth in claim 1 wherein said array of photodiodes is a planar array of diodes.

\* \* \* \* \*